United States Patent [19]
Tomita et al.

[11] Patent Number: 5,879,854
[45] Date of Patent: Mar. 9, 1999

[54] PHOTORESIST LAYER SUPPORTING POLYESTER FILM AND PHOTORESIST FILM LAMINATE

[75] Inventors: Hiroshi Tomita; Kei Mizutani; Kinji Hasegawa, all of Sagamihara, Japan

[73] Assignee: Teijin Limited, Osaka, Japan

[21] Appl. No.: 904,579

[22] Filed: Aug. 6, 1997

[30] Foreign Application Priority Data

Aug. 7, 1996 [JP] Japan .................................. 8-208321
Nov. 1, 1996 [JP] Japan .................................. 8-291802

[51] Int. Cl.[6] ................................. G03F 7/11; G03F 7/09
[52] U.S. Cl. ..................................... 430/272.1; 430/273.1; 430/162; 428/304.4; 428/149; 428/307.3; 428/402; 428/480
[58] Field of Search ............................. 430/271.1, 273.1, 430/533, 162, 272.1; 428/304.4, 149, 307.3, 402, 480

[56] References Cited

U.S. PATENT DOCUMENTS

| | | | |
|---|---|---|---|
| 4,818,581 | 4/1989 | Katoh et al. | 428/143 |
| 5,318,833 | 6/1994 | Fujimoto et al. | 428/304.4 |
| 5,384,191 | 1/1995 | Ogawa et al. | 428/323 |
| 5,648,159 | 7/1997 | Sato | 428/327 |

FOREIGN PATENT DOCUMENTS

| | | |
|---|---|---|
| 0423 402 A | 4/1991 | European Pat. Off. . |
| 0423 829 A | 4/1991 | European Pat. Off. . |
| 7333853 | 12/1995 | Japan . |

OTHER PUBLICATIONS

Patent Abstracts of Japan, vol. 15, No. 13, JP 02263694 S, Oct. 26, 1990.

*Primary Examiner*—Cynthia Hamilton
*Attorney, Agent, or Firm*—Sughrue, Mion, Zinn, Macpeak & Seas, PLLC

[57] ABSTRACT

A photoresist layer supporting polyester film which is a biaxially oriented film formed from a polyester containing 0.01 to 0.1% by weight of porous silica particles that are agglomerates of primary particles having an average particle diameter of 0.01 to 0.1 $\mu$m and have an average particle diameter of 0.1 to 5 $\mu$m and a pore volume of 0.5 to 2.0 ml/g, the number of the porous silica coarse particles having a major diameter of not smaller than 50 $\mu$m being 10 or less per $m^2$; and a photoresist film laminate comprising the above polyester film and a photoresist layer and a protective film, the photoresist layer and the protective film being laminated on one surface of the photoresist layer supporting polyester film. The above photoresist layer supporting polyester film is excellent in transparency and handling properties (slipperiness), and the above photoresist film laminate has excellent resolution and is almost free from circuit defect.

13 Claims, No Drawings

PHOTORESIST LAYER SUPPORTING POLYESTER FILM AND PHOTORESIST FILM LAMINATE

DETAILED DESCRIPTION OF THE INVENTION

1. [Field of the Invention]

This invention relates to a photoresist layer supporting polyester film and a photoresist film laminate. More specifically, it relates to a photoresist layer supporting polyester film having excellent transparency and slipperiness and to a photoresist film laminate comprising the same.

2. [Prior Art]

In recent years, a photoresist film laminate has been used in the production of a printed circuit board. The photoresist film laminate has generally a laminate structure consisting of a supporting layer, a photoresist layer and a protective layer. As the supporting layer is used a polyester film which is excellent in mechanical, chemical and optical properties.

When a photoresist film laminate is used, the protective layer is first removed, the exposed photoresist layer is laminated on a conductive base material adhered to a substrate, and then, a glass sheet having a printed circuit is laminated onto the surface of the supporting film side. Subsequently, the resulting laminate is subjected to irradiation with light from the side of the glass sheet to expose the photosensitive resin of the photoresist layer to light to cause reaction, and then unreacted portions of the photoresist layer are removed by a solvent or the like. Further, when etching is performed using an acid or the like, the conductive base material exposed by the removal of the photoresist layer is removed, the photosensitive resin reacts, and portions of the conductive base material not removed by the solvent or the like remain as they are. Thereafter, when the remaining photoresist layer is removed by an appropriate means, a conductive base material layer is formed as a circuit on the substrate.

Therefore, the polyester film used as the supporting layer must have high transparency and low film haze. When the photoresist layer is exposed to light, light passes through the supporting layer. Therefore, when the transparency of the supporting layer is low, problems will arise that the photoresist layer may not be fully exposed to light or light may be scattered, thereby deteriorating the resolution.

On the other hand, to improve handling properties in the production of a photoresist film laminate or the handling properties of a photoresist film itself, it is required that the polyester film which is a supporting layer have a proper degree of slipperiness.

Heretofore, to meet both of the above requirements, fine particles are contained in the polyester film to form fine protrusions on the surface of the film.

For example, JP-A 7-333853 (the term "JP-A" as used herein means an "unexamined published Japanese patent application") proposes a biaxially oriented laminated polyester film for a photoresist which contains particles having an average particle diameter of 0.01 to 3.0 $\mu$m (such as spherical or amorphous silica particles or spherical cross-linked polymer particles) in the outermost layer of at least one side of the film, the outermost layer surface having an Ra of not less than 0.005 $\mu$m, an Rt of less than 1.5 $\mu$m and a film haze of not more than 1.5%.

However, in the above polyester film, when the fine particles are added to such an extent that satisfactory handling properties are obtained, voids are produced at the time of orientation thereby to invite reduction in transparency with the result that the obtained polyester film cannot be used as a photoresist layer supporting film. Furthermore, the production costs of the above-described laminated polyester film are high.

It is therefore an object of the present invention to solve the above problems of the prior art and to provide an excellent polyester film as a photoresist layer supporting film which meets both requirements for transparency and handling properties (slipperiness) and can be satisfactorily used even when it is a single-layer film and not a laminate film.

The inventors of the present invention have conducted intensive studies to achieve the above objects and have found that no voids are produced at the time of orientation and transparency is greatly improved when porous silica particles having a specific shape are used in place of conventionally used spherical or amorphous silica particles or spherical cross-linked polymer particles. This finding has led to the present invention.

The present invention which has been attained by the above finding is a photoresist layer supporting polyester film which is a biaxially oriented film formed from a polyester containing 0.01 to 0.1% by weight of porous silica particles that are agglomerates of primary particles having an average particle diameter of 0.01 to 0.1 $\mu$m and have an average particle diameter of 0.1 to 5 $\mu$m and a pore volume of 0.5 to 2.0 ml/g, the number of the porous silica coarse particles having a major diameter of not smaller than 50 $\mu$m being 10 or less per $m^2$.

According to the present invention, there are further provided (a) a photoresist laminate consisting of (1) the above supporting polyester film and (2) a photoresist layer and further (b) a photoresist laminate consisting of (1) the above supporting polyester film, (2) a photoresist layer and (3) a protective layer in the mentioned order.

A more detailed description will be given of the photoresist layer supporting polyester film and the photoresist laminate of the present invention.

A polyester used in the photoresist layer supporting polyester film of the present invention is a thermoplastic polyester comprising an aromatic dicarboxylic acid as a main acid component and an aliphatic glycol as a main glycol component. The polyester is substantially linear and has film-forming ability, especially film-forming ability by melt molding. Aromatic dicarboxylic acids include, for example, terephthalic acid, naphthalenedicarboxylic acid, isophthalic acid, diphenylethanedicarboxylic acid, diphenyldicarboxylic acid, diphenyl ether dicarboxylic acid, diphenyl sulfone dicarboxylic acid, diphenyl ketone dicarboxylic acid, anthracenedicarboxylic acid, and the like. Aliphatic glycols include, for example, polymethylene glycols having 2 to 10 carbon atoms such as ethylene glycol, trimethylene glycol, tetramethylene glycol, pentamethylene glycol, hexamethylene glycol and decamethylene glycol; aliphatic diols such as 1,4-cyclohexanedimethanol; and the like.

In the present invention, polyesters comprising alkylene terephthalate or alkylene naphthalate as a main constituent component are preferred.

Of the above polyesters, polyesters comprising terephthalic acid or 2,6-naphthalenedicarboxylic acid in a proportion of not less than 80 mol % of the whole dicarboxylic acid component and ethylene glycol in a proportion of not less than 80 mol % of the whole glycol component are particularly preferred. Further, polyesters comprising ethylene terephthalate units or ethylene-2,6-naphthalate units in a proportion of at least 80 mol %, preferably at least 90 mol % of the total of all the recurring units are advantageous.

In the above cases, 20 mol % or less of the whole acid component can be the above aromatic dicarboxylic acids other than terephthalic acid or 2,6-naphthalenedicarboxylic acid, e.g., aliphatic dicarboxylic acids such as adipic acid and sebacic acid; alicyclic carboxylic acids such as cyclohexane-1,4-dicarboxylic acid; and the like. And, 20 mol % or less of the whole glycol component can be the above glycols other than ethylene glycol, e.g., aromatic diols such as hydroquinone, resorcin and 2,2-bis(4-hydroxydiphenyl)propane; aliphatic diols having an aromatic ring such as 1,4-dihydroxymethylbenzene; polyalkylene glycols (polyoxyalkylene glycols) such as polyethylene glycol, polypropylene glycol and polytetramethylene glycol; and the like.

The polyester of the present invention may be copolymerized with a component derived from an oxycarboxylic acid such as an aromatic oxyacid exemplified by hydroxybenzoic acid or an aliphatic oxyacid exemplified by ω-hydroxycaproic acid in a proportion of not more than 20 mol % based on the total amount of dicarboxylic acid components and oxycarboxylic acid components.

Further, the polyester of the present invention may also be copolymerized with a tri- or more functional polycarboxylic acid or polyhydroxy compound such as trimellitic acid or pentaerythritol in an amount that it is substantially linear, or in an amount of not more than 2 mol % based on the whole acid component. The polyester is known per se and can be produced by a known method per se.

The polyester preferably has an intrinsic viscosity measured in an o-chlorophenol solution at 35° C. of about 0.4 to 0.9.

The photoresist layer supporting polyester film of the present invention must contain porous silica particles having a specific shape. If it contains spherical or amorphous silica particles as in the prior art, voids will be produced at the time of orientation and the resulting film cannot achieve sufficient transparency to be used as a photoresist layer supporting film.

The average particle diameter of primary particles constituting the porous silica particles must be in the range of 0.01 to 0.1 µm. If the average particle diameter of the primary particles is smaller than 0.01 µm, ultrafine particles will be produced by disintegration at the slurry stage and form coarse agglomerates disadvantageously. If the average particle diameter of the primary particles is larger than 0.1 µm, the porosity of the particles will be lost, whereby their affinity for the polyester will be lost, voids will tend to be readily produced, and transparency will be thereby lost disadvantageously.

Further, the pore volume of the porous silica particles in the present invention must be in the range of 0.5 to 2.0 ml/g, preferably 0.6 to 1.8 ml/g. If the pore volume is less than 0.5 ml/g, the porosity of the particles will be lost, whereby voids will be liable to produce and transparency will lower disadvantageously. If the pore volume is more than 2.0 ml/g, disintegration and agglomeration are liable to occur, thereby making it difficult to adjust the particle diameter.

The average particle diameter of the agglomerated porous silica particles in the present invention must be in the range of 0.1 to 5 µm, preferably 0.3 to 3 µm. If the average particle diameter is less than 0.1 µm, the film slipperiness will be insufficient, whereas if the average particle diameter is more than 5 µm, the film surface will be too rough, whereby the adhesion of the film to the glass sheet having a printed circuit will be insufficient and resolution will deteriorate disadvantageously.

The amount of the porous silica particles added is 0.01 to 0.1% by weight, preferably 0.02 to 0.06% by weight. If the amount is less than 0.01% by weight, the film slipperiness will be insufficient, whereas if the amount is more than 0.1% by weight, transparency will lower disadvantageously.

The photoresist layer supporting polyester film of the present invention is generally used as a biaxially oriented polyester film and coarse particles having a size of 50 µm or larger must be contained in the film in the number of 10 or less, preferably 5 or less, more preferably 3 or less, per m$^2$. If the number of coarse particles having a size of not smaller than 50 µm is more than 10 per m$^2$, non-uniform protrusions will be formed on the film surface, the adhesion of the film to the glass sheet having a printed circuit will lower, and resolution will deteriorate disadvantageously. The number of the coarse particles as large as 100 µm or more is preferably 2 or less per m$^2$.

To adjust the number of coarse particles to 10 or less per m$^2$, filtration is preferably carried out with a nonwoven filter formed from a stainless steel fine wire having a wire diameter of not more than 15 µm and having an average aperture of 10 to 30 µm, preferably 15 to 25 µm as a filter used at the time of film formation. If the aperture of the filter is greater than 30 µm, the effect for reducing the number of coarse particles contained in a molten polymer will not be achieved. On the other hand, if the aperture is smaller than 10 µm, pressure or a pressure rise at the time of filtration will be large, thereby making it difficult to implement it as a filter industrially. If the wire diameter is more than 15 µm, coarse particles cannot be captured at an average aperture of 10 to 30 µm.

When other network structure or sintered metal is used as a filter, even if the average aperture thereof is the same or smaller than the above average aperture, it is difficult to capture porous silica coarse particles. It is assumed that this is because a stainless steel fine wire constituting the nonwoven filter serves not only to capture porous silica coarse particles but also to disintegrate and disperse the coarse particles of primary particles.

The porous silica particles are generally added to a reaction system (preferably as a slurry in the glycol) at any time during a reaction for forming a polyester, e.g., during an ester exchange reaction in the case of an ester exchange method or during a polycondensation reaction, or at any time in the case of a direct polymerization method. Particularly preferably, they are added to the reaction system at the beginning of a polycondensation reaction, for example, before the intrinsic viscosity reaches about 0.3.

The polyester film of the present invention is basically produced by melt forming the above polyester into a film by a known method per se, biaxially stretching the film and further heating it. The method and conditions of each step of the above production process can be selected from known methods and conditions. Describing in more detail, the polyester is first molten and extruded from a slit die into a sheet, and the sheet is cooled and solidified on a casting drum to form an unstretched sheet. This unstretched sheet is stretched to 3 to 5 times in the longitudinal and transverse directions at a stretch temperature of 70° to 120° C. and then heat set at 200° to 250° C.

The thickness of the polyester film of the present invention is 10 to 40 µm, preferably 12 to 36 µm. If the thickness is less than 10 µm, handling properties at the time of producing a laminate will deteriorate. Particularly when it is not more than 6 μm, the film has insufficient stiffness and poor release properties disadvantageously.

It is desirable that the thus obtained polyester film for a photoresist of the present invention have a center line average roughness (Ra) of 0.01 to 0.042 μm, preferably 0.015 to 0.042 μm, and it is advantageous that the film have a film haze of not more than 5%, preferably not more than 4%, when the thickness of the film is 25 μm. Owing to these characteristic properties, the film is excellent in both transparency and slipperiness and can be advantageously used as a photoresist layer supporting film.

Further, the polyester film of the present invention may be constituted by a polyester film containing, as a laminate polyester film consisting of two or more layers, the above porous silica particles in the outermost layer thereof, as descried in JP-A 7-333853. However, even when it is formed of a single-layer film, it can achieve sufficient transparency and slipperiness as a photoresist layer supporting film.

A photoresist film laminate can be formed by using the photoresist layer supporting polyester film of the present invention as a supporting layer and laminating a photoresist layer and a protective layer on this film by a commonly employed method.

As the photoresist photosensitive layer in the present invention may be used any layer of the photosensitive resin composition of a known alkali developing type, solvent developing type or dry developing type.

The photosensitive laminate of the present invention basically consists of two layers: a supporting polyester film and a photoresist photosensitive layer. From viewpoints of storage, transportation and handling, it is desirably a three-layer structure consisting of a supporting polyester film, a photoresist photosensitive layer and a protective film.

The photoresist layer is a layer which is cured when it is exposed to visible light or ultraviolet light and formed from a composition comprising a carboxyl group-containing binder polymer, a photopolymerization initiator and a polymerizable vinyl compound. Examples of the carboxyl group-containing binder polymer include acrylic acid alkyl esters, methacrylic acid alkyl esters, acrylic acids, methacrylic acids and vinyl group-containing compounds copolymerizable therewith. Examples of the photopolymerization initiator include aromatic ketones such as benzophenone, Michler's ketone and the like. Examples of the polymerizable vinyl compound include polyethylene glycol diacrylates, polypropylene glycol diacrylates and the like.

The composition constituting a photoresist layer may contain a plasticizer, a thermal polymerization inhibitor, a dye, a pigment, a filler, an adhesion imparting agent, a photo-coloring agent, a flame retardant and the like as required.

The thickness of the photoresist layer is preferably 10 to 100 μm, more preferably 15 to 75 μm.

The photoresist layer is cured under irradiation from a light source such as an ultra-high pressure mercury lamp.

The protective film is aimed to protect the surface of the photoresist layer form dust and flaws and is removed from the photoresist layer of a photoresist film laminate.

The material, color and thickness of a film for forming the protective film are not limited to any particular ones so long as the film is effective in protecting the surface of a photoresist layer form dust and flaws.

The protective film is preferably a polyethylene film, polypropylene film, paper laminated with polyethylene or polypropylene, polyester film, cellulose film, nylon film or the like. These films may be stretched or unstretched films. These films must not be firmly adhered to the photoresist photosensitive layer. This protective film preferably has a thickness of 10 to 100 μm.

The above two-layer structure consisting of a supporting polyester film and a photoresist photosensitive layer can be produced by coating a solution of a photosensitive resin composition dissolved in a solvent to the supporting polyester film by any means such as cast coating, roll coating, spraying or extrusion coating and drying the coating film. The three-layer structure consisting of a supporting polyester film, a photoresist photosensitive layer and a protective film can be produced by forming the photoresist photosensitive layer on the supporting polyester film and then the protective layer film on the photoresist photosensitive layer or by forming the photoresist photosensitive layer on the protective layer film and then the supporting polyester film on the photoresist photosensitive layer.

The two-layer structure can be directly used as the photosensitive laminate of the present invention, whereas the three-layer structure can be used as the photosensitive laminate by first removing the protective layer film, placing a laminate consisting of a supporting polyester film and a photoresist photosensitive layer on a conductive base material adhered onto a substrate in such a manner that the surface of the photoresist photosensitive layer comes into contact with the conductive base material and then, bonding by pressure the laminate to the conductive base material.

According to the present invention, there can be provided a photoresist layer supporting film which meets both requirements for transparency and handling properties (slipperiness) and is capable of being used as a single-layer film without being made into a laminate film. Further, a high-quality photoresist film laminate having excellent resolution and free from circuit defects can be obtained from this photoresist layer supporting film at a low cost.

The following examples are given to further illustrate the present invention. In the examples, characteristic properties were obtained by the following methods.

1. Particle diameter

The average particle diameter of primary particles is obtained from 100 primary particles by dispersing silica powders in such a manner that the particles are not overlapped with one another as much as possible, forming a metal deposited film on the surface of each particle to a thickness of 200 to 300 angstroms with a gold sputtering device, observing a shape of the particle at a magnification of 10,000× to 30,000× through a scanning electron microscope and analyzing the obtained image of the shape of the particle using the Luzex 500 of Nippon Regulator Co., Ltd. As for the average particle diameter of particles which are agglomerates of primary particles, the diameter at an integrate volume percentage of 50% in an equivalent sphere distribution measured by a centrifugal sedimentation type particle size distribution measuring apparatus is adopted.

2. Pore volume

This is measured by a nitrogen absorption/desorption method and calculated by a BET method.

3. Size and number of coarse particles contained in film

The image of the shape of particles is enlarged to 20 times by transmission illumination using a universal projector to count the number of coarse particles having a maximal length of not less than 50 μm. The measurement area is 1 m$^2$.

4. Center line average roughness (Ra)

A chart is drawn under conditions of a magnification of 200,000× a cut-off of 0.08 mm, a needle radius of 2 μm and a load of 30 mg, using the SE-3FAT high-precision surface roughness meter of Kosaka Laboratories Ltd. in accordance with JIS B0601. A portion having a measurement length L in the direction of the center line of the curve is extracted from a surface roughness curve, and the center line of the extracted portion is taken as an X axis and the direction of the perpendicular magnification is taken as a Y axis. When the roughness curve is represented by y=f(x), a value given by the following equation is expressed in unit of μm.

$$Ra = \frac{1}{L} \int_{L0}^{L1} |f(x)| dx$$

This measurement is carried out on four particles with a reference length of 1.25 mm and an average value of the measurement values is taken.

5. Film haze

This is measured using the integrating sphere type haze meter of Nippon Seimitsu Kogaku Co., Ltd. in accordance with JIS-K7105.

6. Photoresist film properties

A printed circuit is formed on the obtained photoresist film to evaluate resolution and occurrence of circuit defect. In other words, the photoresist layer of a photoresist film from which a protective layer has been removed is laminated to a copper sheet provided on a glass fiber-containing epoxy resin sheet, a glass sheet having a printed circuit is laminated on the photoresist layer, the resulting laminate is exposed to ultraviolet light projected from the glass sheet side, the photoresist film is removed from the laminate, and the laminate is cleaned and etched thereby to form a circuit. The resolution and circuit defect of the laminate are observed visually and evaluated based on the following criteria.

(a) Resolution

○: Resolution is high and a sharp circuit pattern is obtained.

Δ: The sharpness of a circuit pattern is slightly poor and such a phenomenon as a bold line is observed.

X: The sharpness is poor and a practically usable circuit cannot be obtained.

(b) Occurrence of circuit defect

○: No circuit defects are observed.

Δ: Several circuit defects are observed.

X: Many circuits defects are observed and the circuit cannot be put to practical use.

7. Slipperiness (handling properties)

Slipperiness is evaluated based on the following three criteria in the step of winding a film including film-slitting at the time of film formation and the step of producing the above photoresist film.

○: The film is not wrinkled and has no problems.

Δ: The film is sometimes wrinkled.

X: The film is always partially or wholly wrinkled.

8. Release properties of supporting film after exposure

The release properties of a polyester film as a supporting film at the time when the film after exposure is peeled off from the photoresist photosensitive layer is evaluated based on the following criteria.

○: Releasing is easily conducted and the photoresist surface is not damaged at all.

X: The photoresist resin is adhered to the film surface in a spot or larger area and the photoresist surface is damaged.

EXAMPLE 1

Manganese acetate as an ester exchange catalyst, antimony trioxide as a polymerization catalyst, phosphorous acid as a stabilizer and 0.05% by weight of porous silica particles having an average particle diameter of 1.5 μm and a pore volume of 1.6 ml/g which are agglomerates of primary particles having an average particle diameter of 0.02 μm were added to dimethyl terephthalate and ethylene glycol, and the mixture was subjected to ester exchange and polycondensation reactions to obtain polyethylene terephthalate (PET) having an intrinsic viscosity of 0.65.

Thereafter, pellets of the obtained PET were dried at 170° C. for 3 hours, supplied to the hopper of an extruder, molten at a melting temperature of 290° C., filtrated through a nonwoven filter having an average aperture of 24 μm and made of a stainless steel fine wire having a wire diameter of 13 μm, and cast over a rotary drum through a slit die to obtain an unstretched film. The thus obtained unstretched film was stretched to 3.7 times in a longitudinal direction at 95° C. and then to 4.0 times in a transverse direction at 110° C., and heat set at 235° C. for 5 seconds to obtain a 25 μm-thick biaxially oriented film.

A photoresist layer and a protective layer were laminated on the thus obtained biaxially oriented film to form a printed circuit, and the characteristic properties thereof were evaluated. The results are shown in Table 1. The obtained film had good transparency and slipperiness and exhibited excellent photoresist film characteristics and handling properties.

COMPARATIVE EXAMPLE 1

A polyester film was produced in the same manner as in Example 1 except that 0.01% by weight of spherical silica particles having an average particle diameter of 1.5 μm was added in place of porous silica particles. The results are shown in Table 1. The obtained film had poor slipperiness and was inferior in handling properties.

COMPARATIVE EXAMPLE 2

When the amount of the spherical silica particles to be added was increased to 0.3% by weight to improve slipperiness in Comparative Example 1, transparency greatly lowered and photoresist film characteristics deteriorated as shown in Table 1.

TABLE 1

| | Silica | | Ra (μm) | Haze (%) | Number of coarse particles (per m²) | Resolution | Occurrence of circuit defect | Slipperiness |
|---|---|---|---|---|---|---|---|---|
| | Kind | Amount (wt %) | | | | | | |
| Ex. 1 | Porous | 0.05 | 0.028 | 2.9 | 2 | ○ | ○ | ○ |
| Comp. Ex. 1 | Spherical | 0.01 | 0.012 | 3.5 | 0 | ○ | ○ | X |
| Comp. Ex. 2 | Spherical | 0.3 | 0.035 | 30 | 1 | X | X | ○ |

Ex.: Example
Comp. Ex.: Comparative Example

EXAMPLES 2 TO 11 AND COMPARATIVE EXAMPLES 3 TO 8

The average particle diameter of primary particles, the pore volume and the average particle diameter of agglomerates of primary particles in Example 1 were changed as shown in Table 2. The results are shown in Table 3. When the average particle diameter of primary particles was in the range of 0.01 to 0.1 μm, the pore volume in the range of 0.5 to 2.0 ml/g and the average particle diameter of the agglomerates in the range of 0.1 to 5 μm, good results were obtained. Particularly, when the pore volume was in the range of 0.6 to 1.8 ml and the average particle diameter of the agglomerates in the range of 0.3 to 3 μm, preferable results were obtained.

TABLE 2

| | Average particle size of primary particle (μm) | Pore volume (ml/g) | Average particle size of agglomerate (μm) |
|---|---|---|---|
| Comp. Ex. 3 | 0.005 | 1.2 | 1.5 |
| Ex. 2 | 0.02 | 1.2 | 1.5 |
| Ex. 3 | 0.08 | 1.2 | 1.5 |
| Comp. Ex. 4 | 0.11 | 1.2 | 1.5 |
| Comp. Ex. 5 | 0.05 | 0.4 | 1.5 |
| Ex. 4 | 0.05 | 0.5 | 1.5 |
| Ex. 5 | 0.05 | 0.6 | 1.5 |
| Ex. 6 | 0.05 | 1.8 | 1.5 |
| Ex. 7 | 0.05 | 2.0 | 1.5 |
| Comp. Ex. 6 | 0.05 | 2.1 | 1.5 |
| Comp. Ex. 7 | 0.05 | 1.2 | 0.08 |
| Ex. 8 | 0.05 | 1.2 | 0.15 |
| Ex. 9 | 0.05 | 1.2 | 0.3 |
| Ex. 10 | 0.05 | 1.2 | 3.0 |
| Ex. 11 | 0.05 | 1.2 | 4.8 |
| Comp. Ex. 8 | 0.05 | 1.2 | 5.2 |

Ex.: Example
Comp. Ex.: Comparative Example

TABLE 3

| | Ra (μm) | Haze (%) | Number of coarse particles (per m$^2$) | Resolution | Occurrence of circuit defect | Slipperiness |
|---|---|---|---|---|---|---|
| Comp. Ex. 3 | 0.030 | 2.6 | 7 | X | X | X |
| Ex. 2 | 0.030 | 2.7 | 3 | ○ | ○ | ○ |
| Ex. 3 | 0.032 | 3.8 | 2 | ○ | ○ | ○ |
| Comp. Ex. 4 | 0.034 | 5.1 | 4 | X | X | Δ |
| Comp. Ex. 5 | 0.032 | 5.2 | 4 | X | X | X |
| Ex. 4 | 0.031 | 4.2 | 4 | ○ | ○ | ○ |
| Ex. 5 | 0.031 | 3.9 | 2 | ○ | ○ | ○ |
| Ex. 6 | 0.028 | 2.8 | 3 | ○ | ○ | ○ |
| Ex. 7 | 0.028 | 2.6 | 6 | ○ | ○ | ○ |
| Comp. Ex. 6 | 0.026 | 2.5 | 11 | X | X | Δ |
| Comp. Ex. 7 | 0.009 | 1.0 | 15 | Δ | Δ | X |
| Ex. 8 | 0.011 | 1.1 | 4 | ○ | ○ | ○ |
| Ex. 9 | 0.013 | 1.4 | 3 | ○ | ○ | ○ |
| Ex. 10 | 0.035 | 3.8 | 2 | ○ | ○ | ○ |
| Ex. 11 | 0.042 | 4.9 | 3 | ○ | ○ | ○ |
| Comp. Ex. 8 | 0.043 | 5.2 | 4 | X | X | ○ |

Ex.: Example
Comp. Ex.: Comparative Example

EXAMPLES 12 TO 15 AND COMPARATIVE EXAMPLES 9 AND 10

The amount of the porous silica particles to be added in Example 1 was changed as shown in Table 4. The results are shown in Table 4. When the amount was 0.01 to 0.1% by weight (preferably 0.02 to 0.06% by weight), good results were obtained.

TABLE 4

| | Amount of silica (wt %) | Ra (μm) | Haze (%) | Number of coarse particles (per m$^2$) | Resolution | Occurrence of circuit defect | Slipperiness | Release properties |
|---|---|---|---|---|---|---|---|---|
| Comp. Ex. 9 | 0.005 | 0.008 | 1.1 | 0 | ○ | ○ | X | X |
| Ex. 12 | 0.01 | 0.012 | 1.3 | 1 | ○ | ○ | ○ | ○ |
| Ex. 13 | 0.02 | 0.017 | 1.7 | 1 | ○ | ○ | ○ | ○ |
| Ex. 14 | 0.06 | 0.030 | 3.3 | 2 | ○ | ○ | ○ | ○ |
| Ex. 15 | 0.1 | 0.040 | 4.9 | 5 | ○ | ○ | ○ | ○ |
| Comp. Ex. 10 | 0.15 | 0.045 | 7.0 | 7 | X | X | ○ | ○ |

Ex.: Example
Comp. Ex.: Comparative Example

EXAMPLE 16 AND COMPARATIVE EXAMPLE 11

Polyester films were produced in the same manner as in Example 1 except that nonwoven filters of which the average aperture and the wire diameter of a stainless steel fine wire were changed as shown in Table 5 were used when PET polymers containing porous silica particles were molten and filtrated with the filter.

The results are shown in Table 5. When the filter wire diameter was 17 μm, the average aperture of the filter was 30 μm, and the number of coarse particles was more than 10 per m², a reduction in resolution and the occurrence of circuit defects caused by improper adhesion between the polyester films and a circuit printed glass sheet were observed.

TABLE 5

| | Filter | | | | Number of | | | |
| | Wire size (μm) | Average aperture (μm) | Ra (μm) | Haze (%) | Coarse particles (per m²) | Resolution | Occurrence of circuit defect | Slipperiness |
|---|---|---|---|---|---|---|---|---|
| Ex. 16 | 15 | 27 | 0.028 | 2.9 | 9 | ○ | ○ | ○ |
| Comp. Ex. 11 | 17 | 30 | 0.028 | 2.9 | 12 | X | Δ | ○ |

Ex.: Example
Comp. Ex.: Comparative Example

EXAMPLE 17

Dimethyl terephthalate and ethylene glycol were subjected to an ester exchange reaction in the presence of manganese acetate as an ester exchange catalyst, and after the reaction, antimony trioxide as a polymerization catalyst, phosphorous acid as a stabilizer and 0.05% by weight of porous silica particles having an average particle diameter of 1.5 μm and a pore volume of 1.6 ml/g which were agglomerates of primary particles having an average particle diameter of 0.02 μm were added to and dispersed in the reaction product to perform a polycondensation reaction. Thus, polyethylene terephthalate (PET) having an intrinsic viscosity of 0.65 was obtained.

Thereafter, pellets of the obtained PET were dried at 170° C. for 3 hours, supplied to the hopper of an extruder, molten at a melting temperature of 290° C., filtrated through a nonwoven filter having an average aperture of 24 μm and formed of a stainless steel fine wire having a wire diameter of 13 μm, and cast over a rotary drum through a slit die to obtain an unstretched film. The thus obtained unstretched film was stretched to 3.7 times in a longitudinal direction at 90° C. and then to 4.0 times in a transverse direction at 110° C., and heat set at 235° C. for 5 seconds to obtain a 25 μm-thick biaxially oriented film.

A solution of an alkali-soluble acryl copolymer-based photoresist dissolved in a methyl ethyl ketone solvent was applied to this biaxially oriented film with a roll coater, and dried. The thickness of a photoresist photosensitive layer was 25 μm after drying. Thereafter, a 15 μm-thick polyethylene film was placed on and bonded by pressure to the photoresist photosensitive layer to form a three layer structure consisting of a supporting polyester film, a photoresist photosensitive layer and a protective layer. This three-layer structure was rolled.

After the polyethylene film which was the protective layer was removed from the laminate, the laminate was placed on a copper sheet provided on a glass fiber-containing epoxy resin sheet in such a manner that the photoresist photosensitive layer side came into contact with the copper sheet and bonded to the copper sheet by heating and pressing at 100° C. Thereafter, an original sheet was placed on the supporting polyester film and exposed to light at 120 mJ/cm² with an irradiator. Thereafter, the supporting polyester film was removed. Developing was carried out with an 2% aqueous solution of sodium carbonate to form a printed circuit.

The result is shown in Table 6. The laminate film was excellent in transparency and slipperiness as well as release properties of the supporting polyester film after exposure as a photosensitive layer laminate.

EXAMPLES 18 AND COMPARATIVE EXAMPLE 12

Photosensitive laminates were produced in the same manner as in Example 17 except that the thickness of the polyester film was changed to 12 μm (Example 18) and 9 μm (Comparative Example 12). The results are shown in Table 6. When the thickness of the supporting polyester film was 9 μm, the laminate was inferior in handling properties with poor slipperiness.

COMPARATIVE EXAMPLE 13

A photosensitive laminate was produced in the same manner as in Comparative Example 12 except that the film thickness was changed to 5 μm and the amount of porous silica particles added was changed to 0.1% by weight to improve slipperiness. The results are shown in Table 6. The laminate had poor release properties because of insufficient stiffness of the film and had a problem with resolution.

EXAMPLE 19 AND COMPARATIVE EXAMPLE 14

Photosensitive laminates were produced in the same manner as in Example 17 except that the average particle diameter of primary particles was changed to 0.08 μm (Example 19) and 0.11 μm (Comparative Example 14). The results are shown in Table 6. When the average particle diameter of the primary particle was more than 0.1 μm, transparency and resolution lowered due to the generation of voids.

TABLE 6

| | Ra (μm) | Haze (%) | Number of coarse particles (per m²) | Thickness of supporting film (μm) | Resolution | Occurrence of circuit defect | Slipperi-ness | Release properties |
| --- | --- | --- | --- | --- | --- | --- | --- | --- |
| Ex. 17 | 0.028 | 2.9 | 2 | 25 | ◯ | ◯ | ◯ | ◯ |
| Ex. 18 | 0.027 | 2.9 | 2 | 12 | ◯ | ◯ | ◯ | ◯ |
| Comp. Ex. 12 | 0.025 | 2.9 | 2 | 9 | ◯ | ◯ | X | ◯ |
| Comp. Ex. 13 | 0.055 | 4.9 | 4 | 5 | X | X | Δ | X |
| Ex. 19 | 0.032 | 3.8 | 2 | 25 | ◯ | ◯ | ◯ | ◯ |
| Comp. Ex. 14 | 0.034 | 5.1 | 4 | 25 | X | X | Δ | ◯ |

Ex.: Example
Comp. Ex.: Comparative Example

What is claimed is:

1. A photoresist layer supporting polyester film which is a biaxially oriented film formed from a polyester containing 0.01 to 0.1% by weight of porous silica particles that are agglomerates of primary particles having an average particle diameter of 0.01 to 0.1 μm and have an average particle diameter of 0.1 to 5 μm and a pore volume of 0.5 to 2.0 ml/g, the number of the porous silica coarse particles having a major diameter of not less than 50 μm being 10 or less per m².

2. The photoresist layer supporting polyester film of claim 1 which has a center line average surface roughness (Ra) of 0.01 to 0.042 μm.

3. The photoresist layer supporting polyester film of claim 1 which has a film haze of not more than 5% when the film has a thickness of 25 μm.

4. The photoresist layer supporting polyester film of claim 1 which has a thickness of 10 to 40 μm.

5. The photoresist layer supporting polyester film of claim 1, wherein the polyester comprises ethylene terephthalate units or ethylene-2,6-naphthalate units as a main recurring unit.

6. The photoresist layer supporting polyester film of claim 1, wherein the number of porous silica coarse particles is 5 or less per m².

7. The photoresist layer supporting polyester film of claim 1, wherein the pore volume of porous silica coarse particles is 0.6 to 1.8 ml/g.

8. The photoresist layer supporting polyester film of claim 1, wherein the average particle diameter of porous silica agglomerates is 0.3 to 3 μm.

9. The photoresist layer supporting polyester film of claim 1 which has a film haze of not more than 4% when the film has a thickness of 25 μm.

10. The photoresist layer supporting polyester film of claim 1 which has a center line average surface roughness (Ra) of 0.015 to 0.042 μm.

11. A photoresist film laminate consisting of (1) the polyester film of claim 1 and (2) a photoresist layer.

12. A photoresist film laminate consisting of (1) the polyester film of claim 1, (2) a photoresist layer and (3) a protective film, which are laminated in the mentioned order.

13. The photoresist film laminate of claim 12, wherein the protective film is a polyester film, polyolefin film or polyvinylidene halide film.

* * * * *